United States Patent [19]
Dehara

[11] Patent Number: 5,291,449
[45] Date of Patent: Mar. 1, 1994

[54] IC MEMORY TESTING APPARATUS

[75] Inventor: Masayoshi Dehara, Tokyo, Japan

[73] Assignee: Ando Electric Co., Ltd., Tokyo, Japan

[21] Appl. No.: 976,157

[22] Filed: Nov. 13, 1992

[30] Foreign Application Priority Data

Nov. 25, 1991 [JP] Japan .................. 3-335617

[51] Int. Cl.⁵ .............................. G01R 31/28
[52] U.S. Cl. .............................. 365/201; 371/21.1; 371/21.2
[58] Field of Search ........... 365/201, 200, 221, 230.08, 365/230.09, 239, 240; 371/20.4, 21.1, 21.2, 21.3, 70, 71, 67.1, 53

[56] References Cited

U.S. PATENT DOCUMENTS

| 4,414,665 | 11/1983 | Kimura et al. | 371/21 |
| 4,873,666 | 10/1989 | Lefebvre et al. | 365/221 |
| 5,062,109 | 10/1991 | Ohshima et al. | 371/21.2 |

Primary Examiner—Eugene R. LaRoche
Assistant Examiner—Vu Le
Attorney, Agent, or Firm—Sprung Horn Kramer & Woods

[57] ABSTRACT

An IC memory testing apparatus comprises a pattern generating circuit, a decision circuit, a first-in memory circuit which stores the defect data of a IC memory under test and simultaneously reads the resulting data. A latch circuit is also used to shorten the testing time. The resulting information about the defective cell of the tested IC memory is stored and read out during the test, with the memory circuit executing a storing operation for the address of defective cell data and simultaneously executing a reading operation for the data having been stored. The time periods required for the reading and writing operations are set independently of each other, and the operation frequency of the memory circuit is less than for testing the memory to be tested.

3 Claims, 5 Drawing Sheets

FIG. 7
Prior art
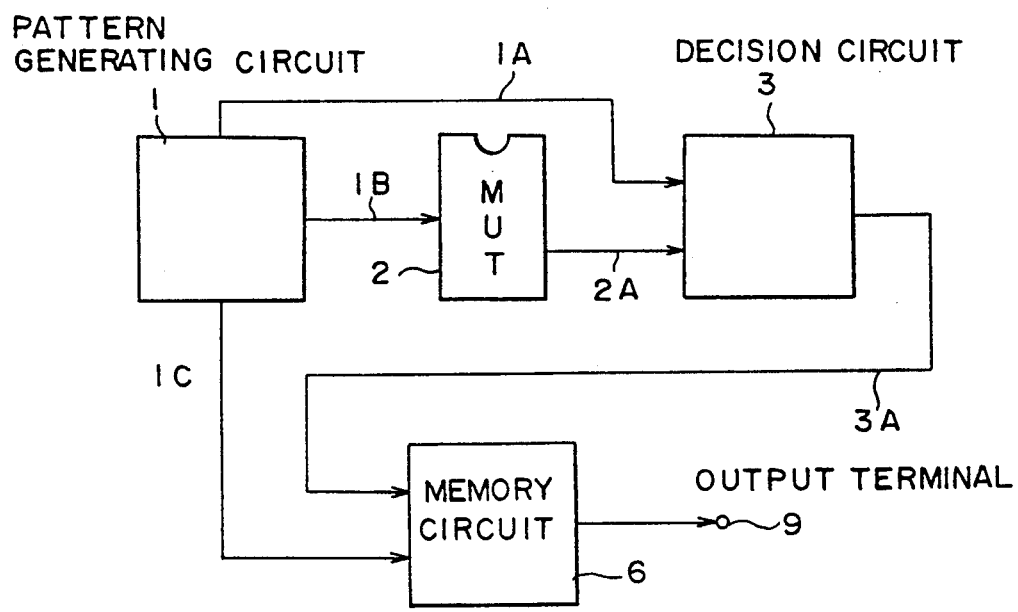
FIG. 8
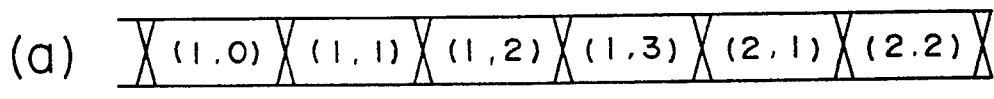
FIG. 9

IC MEMORY TESTING APPARATUS

BACKGROUND OF THE INVENTION

This invention relates to an integral circuit (hereinafter it is referred to as "IC") memory testing apparatus capable of detecting a defective memory cell of an IC memory for storing digital data information. More particularly this invention relates to a testing apparatus in which information about the defective cell can be stored and read out while a predetermined examination signal pattern is being applied to the IC memory to be tested (hereinafter it is referred as "MUT" which means "memory under test").

PRIOR ART

FIG. 7 illustrates a block diagram of one example of a conventional memory testing apparatus. The apparatus of FIG. 7 comprises a pattern generating circuit 1, a MUT 2, a decision circuit 3, a memory circuit 6, and an output terminal 9.

The pattern generating circuit 1 generates a predetermined testing signal pattern 1B to be applied to the MUT 2. The testing signal pattern generated by the circuit 1 includes a test address signal for the MUT 2, a write instruction signal and a data signal to be written. The pattern generating circuit 1 also generates expected data 1A, which are compared with the data read out from the MUT 2 designated by the address signal applied to the MUT 2, and test address signal 1C, which is the same as the test address signal applied to the MUT 2. When the testing signal pattern 1B is applied to the MUT 2, the MUT outputs data 2A which is introduced to the decision circuit 3. In the decision circuit 3, the output data 2A and the expected data 1A are compared with each other. When these data are not in agreement, it is determined that the MUT 2 outputs the defective data. The defect indicating signal 3A is generated when the testing apparatus detects existence of a defective memory cell within the MUT 2. As a result, the decision circuit 3 outputs a defect indicating signal 3A. The memory circuit 6 receives the test address information or signal 1C and the defect indicating signal 3A as inputs. The memory circuit 6 selects the same cell address as that of the test address signal 1C, and writes logical data "1" therein when the tested cell is a defective memory cell.

FIG. 8 illustrates a time chart representing an operation of the apparatus shown in FIG. 7. FIG. 9 illustrates an example of a memory map image of memory contents stored in the memory circuit 6 shown in FIG. 7. FIG. 8 (a) illustrates one example of the test address signal 1C, and (1,0) indicates a numerical representation of the cell address by two dimensional image. FIG. 8 (b) illustrates one example of the defect indicating signal 3A. In this example, the cell address (1,1), (1,2) and (2,1) are defective cells and the signal 3A is outputted from the MUT 2. When the operation shown in FIG. 8 is executed, the memory circuit 6 stores the data "1" in the cell addresses of (1,1), (1,2) and (2,1) as shown in FIG. 9 by two dimensional memory map image. As a result of this operation, the memory map data shown in FIG. 9 coincide with those of the defective memory cells in the MUT 2.

In the prior art technique, the data having been stored in the memory circuit 6 are sequentially read from the cell address (0,0) to the cell address (3,3) from the output terminal 9 after test for the MUT 2 has been completed, and the resulting data are used as evaluation data of the MUT 2. When the resulting data in the memory circuit 6 is read out during the examination of the MUT 2, the test address signal 1C is alternated with the testing address signal of the testing signal pattern 1B so that the memory circuit 6 can be switched between data reading and data writing modes.

In the above described memory testing apparatus in the prior art as shown in FIG. 7, it is necessary to output the defective memory cell memory map data only after the examination of the MUT 2 has been completed. In the case of the data being outputted during the examination, it becomes necessary to switch the memory circuit 6 between the reading mode and the writing mode. Due to this fact, when the data is read after the examination in the former case, it is impossible to output the data during examination. While the data is read during the evaluation in the latter case, it is necessary to operate the memory circuit 6 at an operation frequency which is twice as high as that for the examination of the MUT 2.

SUMMARY OF THE INVENTION

It is, therefore, an object of the present invention to provide an improved memory testing apparatus. For the attainment of this object, the memory testing apparatus of the present invention comprises a first-in first-out memory circuit 4 (hereinafter it is referred to as FIFO memory circuit) and a selecting circuit 5 between the decision circuit 3 and the memory circuit 6 of the memory testing apparatus shown in FIG. 7. The selecting circuit is employed to select either the output data (defective cell address) from the FIFO memory circuit or the read address signal for reading the content of the memory circuit 6. With this arrangement, it not only becomes possible for the memory circuit 6 to store the defective data (defective addresses) at the operation speed of the memory testing apparatus, but also it is possible to read the stored data from the memory circuit.

In this arrangement, the data to be stored into the memory circuit 6, which have been generated during the reading operation of the contents in the memory circuit 6, are temporarily stored into the FIFO memory circuit 4 as the address data to be stored. When the reading operation for the memory circuit 6 is temporarily interrupted, the selecting circuit 5 selects the output from the FIFO memory circuit 4 and reads out the cell address data which is, in turn, transferred from the FIFO memory circuit 4 to the memory circuit 6, thereby to write a logical data "1" into the address corresponding to the defective cell address of the MUT 2. The data in the memory circuit 6 can then be read out during the examination of the MUT 2.

BRIEF DESCRIPTION OF THE FIGURES

FIG. 7 illustrates a block diagram of one example of conventional memory testing apparatus in the prior art.

FIG. 8 illustrates a time chart and wave form representing an operation of the apparatus shown in FIG. 7.

FIG. 9 illustrates a memory map image of memory content stored in the memory circuit shown in FIG. 7.

DETAILED DESCRIPTION OF THE PREFERRED EMBODIMENT

Figure 1:
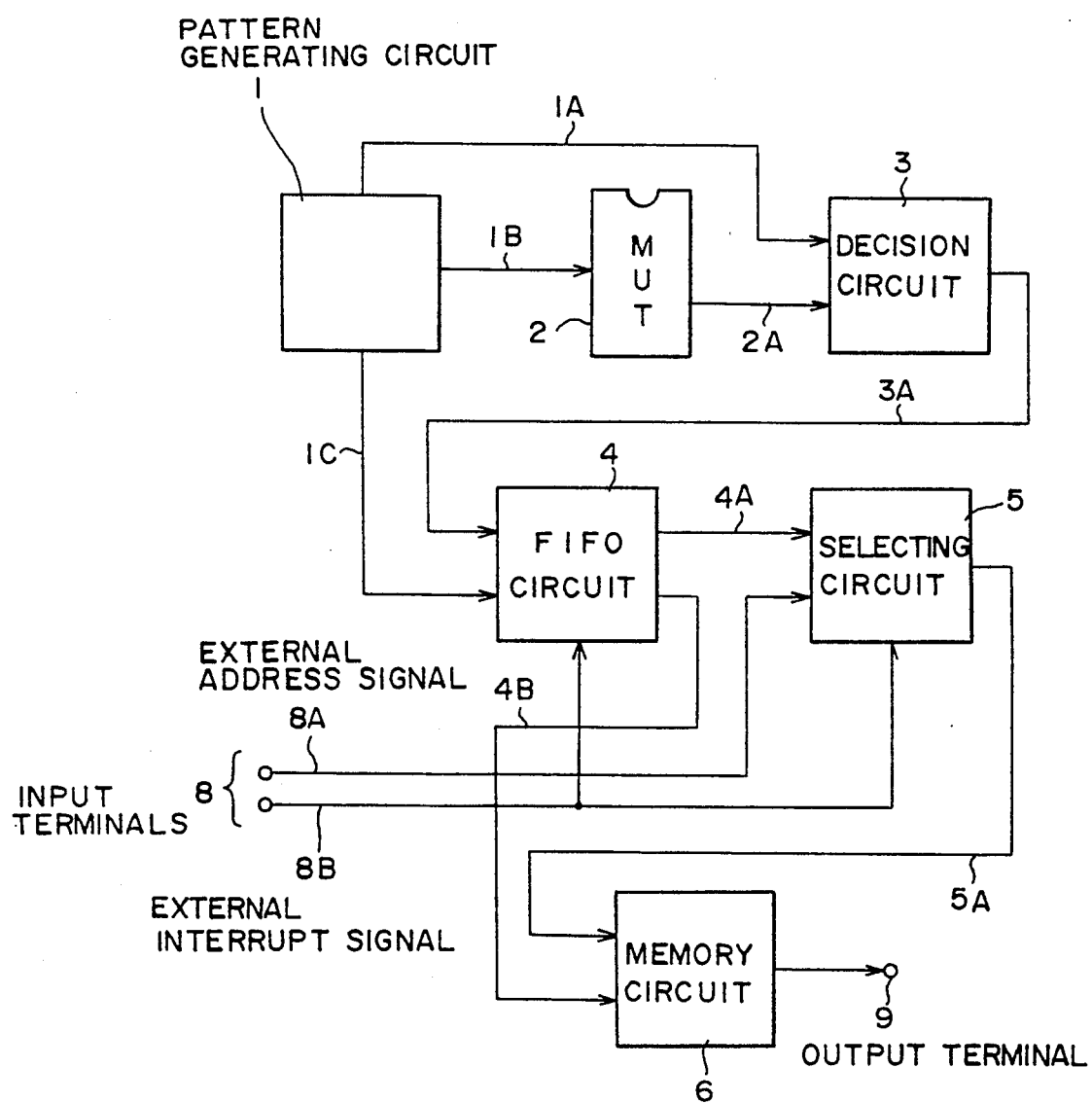
FIG. 1 illustrates an example of block diagram of a memory testing apparatus according to the present invention.

An embodiment of the memory testing apparatus according to the present invention will be described in detail by making reference to FIG. 1. In FIG. 1, an FIFO memory circuit 4 and a selecting circuit 5 are illustrated and the other blocks in the figure are similar to that shown in FIG. 7.

The FIFO memory circuit 4 is adapted to receive the defect indicating signal 3A and the test address signal 1C and to store the defect indicating signal 3A upon reception thereof. The FIFO memory circuit 4 is also adapted to receive an external interrupt signal 8B through an input terminal 8. If the external interrupt signal 8B is not received, a defective address data having been stored in the FIFO memory circuit 4 is outputted therefrom and a FIFO reading state signal 4B is outputted.

The selecting circuit 5 is adapted to receive an output signal 4A from the FIFO memory circuit 4 and an external address signal 8A through the input terminal 8, from which the external interrupt signal 8B is inputted into the selecting circuit 5. When the external interrupt signal 8B is inputted, the external address 8A is selected and outputted as an output signal 5A of the selecting circuit 5. On the other hand, when the signal 8B is not received, the output signal 4A from the FIFO memory circuit 4 is selected and outputted as the output signal 5A of the selecting circuit 5.

The memory circuit 6 is adapted to receive the output signal 5A from the selecting circuit 5 as an address as well as the output signal 4B as a writing signal for writing a logical data "1" into the memory circuit 6. When the output signal 4B from the FIFO memory circuit 4 is not received by the memory circuit 6, the memory circuit 6 outputs the contents of the memory whose address is designated by the output signal 5A from the selecting circuit 5 to the output terminal 9. On the contrary, when the signal 4B from the FIFO memory circuit 4 is received, a logical data "1" is written into the address designated by the output signal 5A.

Figure 2:
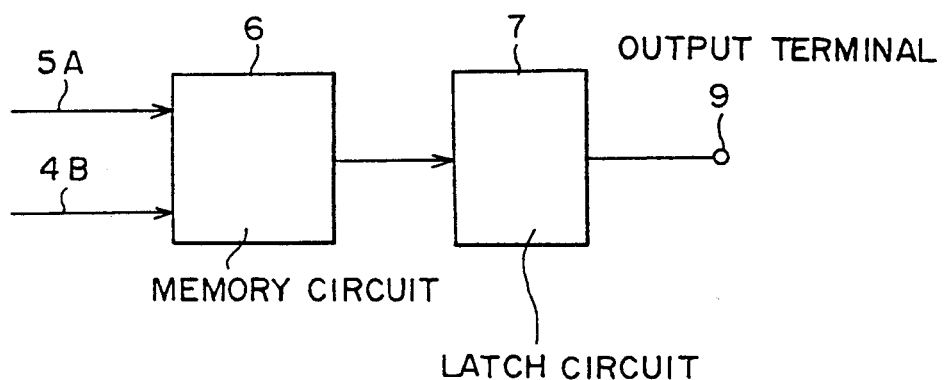
FIG. 2 illustrates an example of modification to be added to the apparatus shown in FIG. 1.

Referring to FIG. 2, an embodiment of the memory testing apparatus shown in FIG. 1 will be described. In FIG. 2, a latch circuit 7 is employed between the memory circuit 6 and the output terminal 8 for the apparatus shown in FIG. 1. By employing the arrangement shown in FIG. 2, it becomes possible to update the data to be transferred to the output terminal 9 only when the memory circuit 6 is set at a reading mode.

Figure 3:
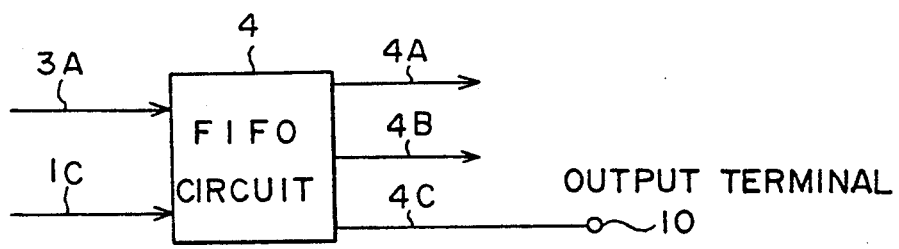
FIG. 3 illustrates an example of another modification of a circuit block to replace in the apparatus shown in FIG. 1.

Referring to FIG. 3, another embodiment of the present invention shown in FIG. 1 will be described. In FIG. 3, a STORAGE FULL output signal, which means the memory capacity of the FIFO memory circuit 4 is full, is outputted from the FIFO memory circuit 4 to an output terminal 10 and the external address signal 8A and the external interrupt signal 8B are applied to the input terminal 8 only when the signal is not detected at the output terminal 10.

Figures 4, 5:
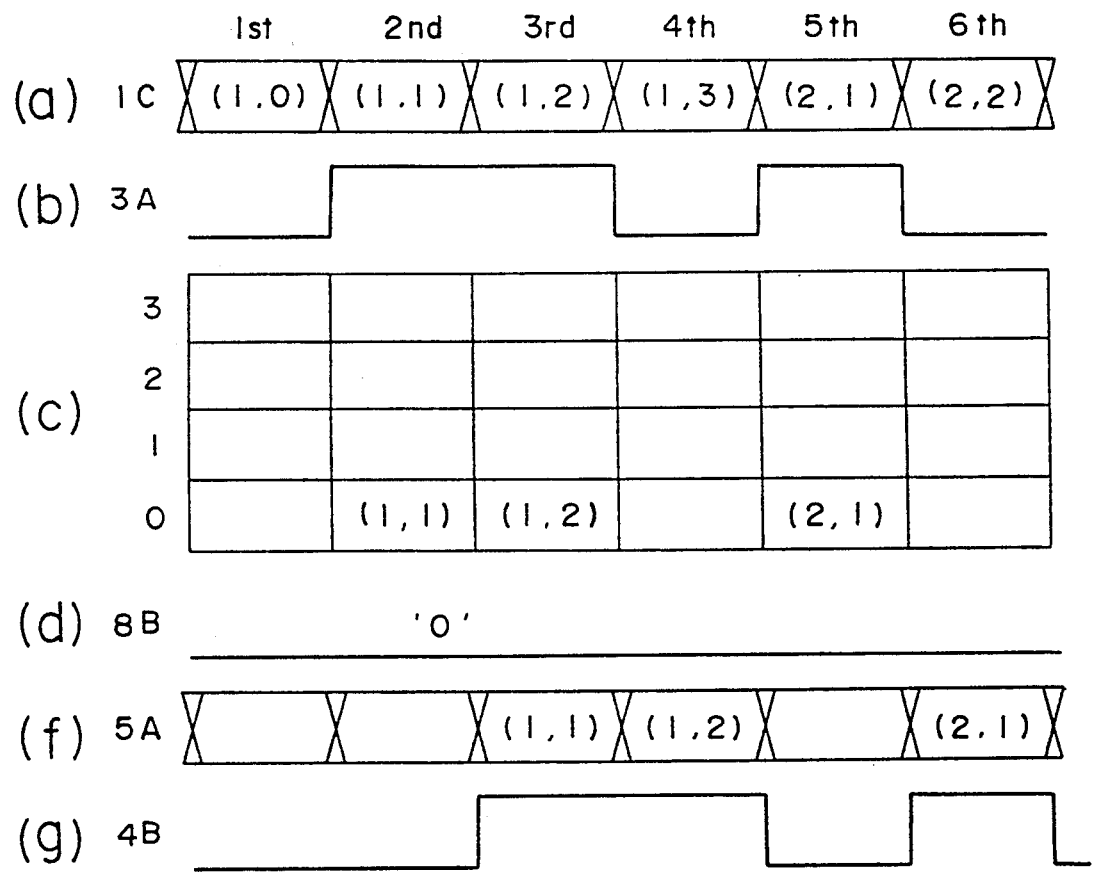
FIG. 4 illustrates one example of operation of the apparatus shown in FIG. 1, with a time chart, wave forms, and memory map image.
FIG. 5 illustrates a memory content of memory circuit with memory map image which is obtained by the operation shown in FIG. 4.

With reference to FIG. 4, a time chart and a state or mode diagram of an operation of the apparatus shown in FIG. 1 will be described further. In FIG. 4, an indication such as (1,0) shows an cell address in the MUT 2 which have been detected by the decision circuit 3 as a defective memory cell of MUT2. Further, the indication from "1st" to "6th" indicate pattern generating sequence. Character (a) of FIG. 4 (a) illustrates a wave form of the test address signal and FIG. 4 (b) illustrates a wave form of the defect indicating signal 3A, FIG. 4 (c) illustrates a mode or state diagram which shows a state of the data storing in the FIFO memory circuit 4, and index "0" to "3" of vertical axis indicates examples of numerical representation of the cell addresses and the figure show the memory map which is arranged in two dimensional image.

FIG. 4 (d) illustrates a wave form of the external interrupt signal 8B, FIG. 4 (e) illustrates a wave form of the output signal 5A from the selecting circuit 5 and FIG. 4 (g) illustrates a wave form of the reading state signal 4B from the FIFO memory circuit 4.

A storing mode in the memory circuit 6 as a memory map, which is obtained by the operation shown in FIG. 4 will be described with reference to FIG. 5. For example, the cell address (2,1) is represented in FIG. 5 as an area whose horizontal position is "2" and vertical position is "1" in the two dimensional memory map.

Figure 6:
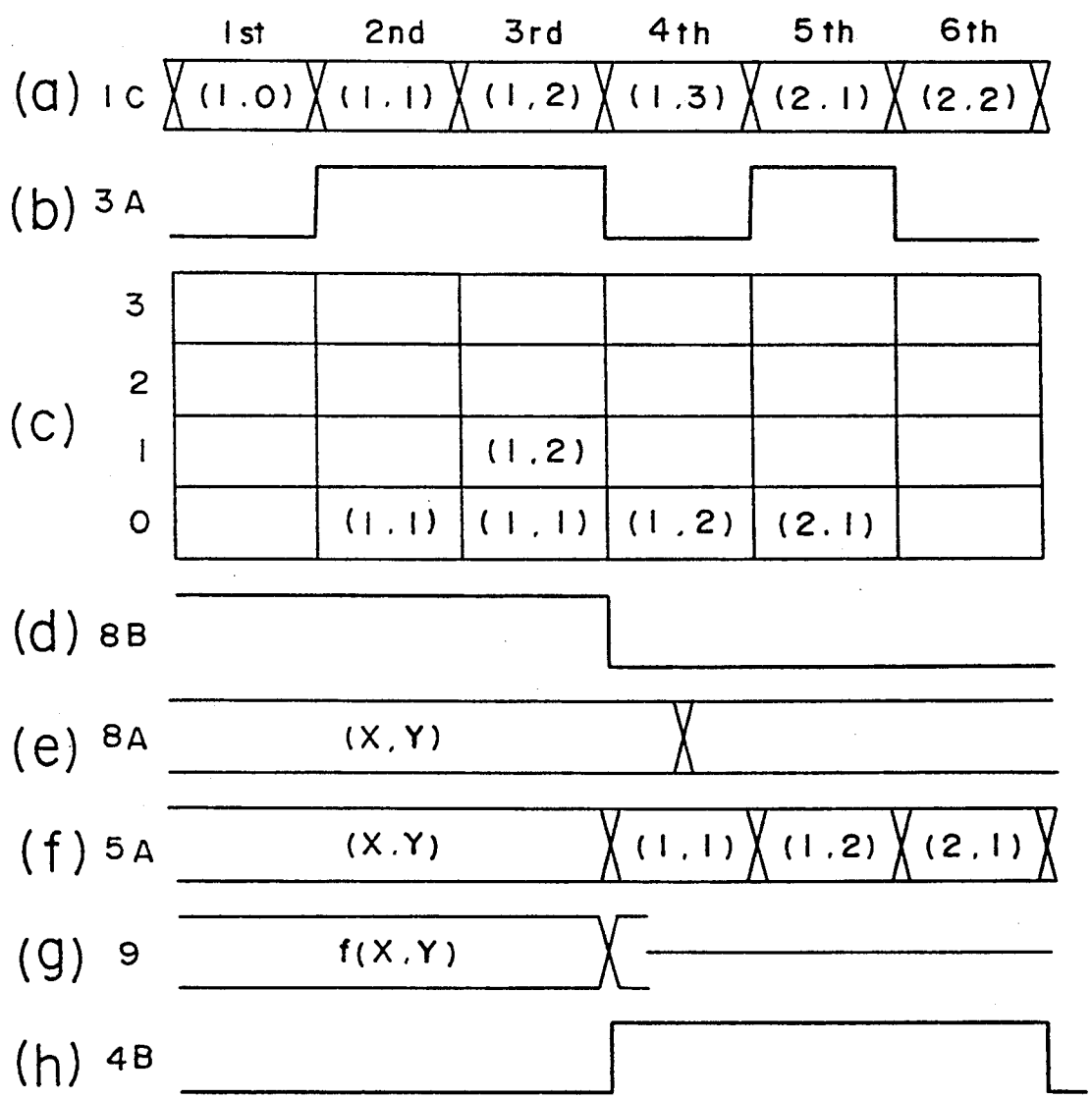
FIG. 6 illustrates example of another operation of the apparatus shown in FIG. 1 with a time chart, wave forms, and memory map image.

Another time chart and state diagram of FIG. 4 will be described further with reference to FIG. 6. Although FIG. 6 (a), (b), (c) and (d) illustrate the same signal of FIG. 4 (a), (b), (c) and (d), but the the state in which these signals are generated are different. FIG. 6 (c) resembles FIG. 4 (c) but the state of the data stored in the FIFO memory circuit 4 differs from each other, as shown in FIG. 4 (c) and FIG. 6 (c). FIG. 6 (e) illustrates the external address signal 8A to be inputted through the input terminal 8 and indication (X,Y) corresponds to a cell address of the memory circuit 6. FIG. 6 (g) illustrates a wave form at the output terminal 9.

The embodiment of the present invention shown in FIG. 1 will be described further. MUT 2 in FIG. 1 is an IC memory to be tested. The memory testing apparatus according to the present invention comprises the elements other than the MUT 2 in FIG. 1. FIG. 4 (a) illustrates an example of the testing cell address information data which is generated by the pattern generating circuit 1. The pattern generating circuit 1 applies the testing signal pattern 1B to the MUT 2, writes the logical data "1" and "0" thereto, and reads the contents having been written therein to confirm.

Cell address of MUT 2 at which the output data 2A is stored is outputted to the FIFO memory circuit 4 as the test address signal 1C. The expected data 1A from the pattern generating circuit 1 and the output data 2A, are compared to confirm with each other at the decision circuit 3. In this comparison, if disagreement between them occurs, the defect indicating signal 3A is outputted under the determination than the memory cell of the tested address in the MUT 2 is defective. FIG. 4 (b) illustrates an example of the defect indicating signal 3A. The test address signal 1C and the defect indicating signal 3A are synchronized to each other in the pattern generating circuit 1 in order that the test address signal 1A and the defect indicating signal 3A are based on the same address of the memory cell in the MUT 2, and in order that the defect indicating signal 3A shows the very cell of the MUT 2 which is designated by the test address signal 1C. In the case of FIG. 4, for example, cell addresses (1,1), (1,2) and (2,1) are the defective cell addresses.

The FIFO memory circuit 4 is adapted to receive the test address signal 1C and the defect indicating signal 3A and to store the tested cell address when a defective cell is detected. In case of FIG. 4, the cell address corresponding to 2nd, 3rd and 5th pattern is stored. FIG. 4 (c) illustrates an internal state of the FIFO memory circuit 4. The index "0", "1", "2" and "3" of vertical axis indicate the memory cell address of FIFO memory circuit 4. A horizontal axis indicates time elapsing direction and it corresponds to from 1st to 6th patterns.

The data written into the FIFO memory circuit 4 are sequentially stored in the memory from the beginning address of users area with whose address number is incrementally changed. After the data have been read out, they are sequentially erased. FIG. 4 (c) illustrates one example of the resulted memory map data during the writing and reading operation. For another embodiment of the present invention, it may be modified that the read out data in the FIFO memory circuit 4 is not sequentially erased. In such embodiment, the writing and reading cell address are incrementally changed under a condition of expression, (writing address) > (reading address).

The FIFO memory circuit 4 executes the reading operation when the external interrupt signal is not detected thereby.

FIG. 4 (d) illustrates an example of operation in which the external interrupt signal 8B is not detected. As shown in the drawing, any address signal is not stored in the FIFO memory circuit 4 at the 1st pattern. The cell address (1,1) is stored at the second pattern. At the 3rd pattern, the cell address (1,2) is stored and the cell address (1,1) is read out. At the 4th pattern, the cell address (1,2) is read out. The cell address (2,1) is stored at the 5th pattern and the cell address (2,1) is read out at the 6th pattern.

The read out signal 4A from the FIFO memory circuit 4 is inputted into the selecting circuit 5. When the external interrupt signal 8B is not detected, the selecting circuit 5 selects to output the signal 4A from the FIFO memory circuit 4 as an output signal 5A of the selecting circuit 5.

FIG. 4 (e) illustrates the operation in such case. The output signal 5A from the selecting circuit 5 is applied to the memory circuit 6 with the FIFO reading state signal 4B from FIFO memory circuit 4. FIG. 4 (f) illustrates one example of the FIFO reading state signal 4B. When FIFO reading state signal 4B is detected, the data "1" is written into a cell whose address is specified as the output signal 5A from the selecting circuit 5. In FIG. 4, the data "1" is written into cell address (1,1), (1,2) and (2,1) at the 3rd, 4th and 6th pattern positions.

FIG. 5 illustrates an example of memory map for the memory circuit 6 in which the result data have been written at above stated operation. For example, with respect to the cell address (1,2) the data "1" is stored at a position whose horizontal component is 1 and vertical component is 2. In the operation shown in FIG. 4 and 5, as the external interrupt signal 8B is not detected, therefore the whole operation thereof becomes the same as that shown in FIG. 7.

With reference to FIG. 6, an example of the operation is described when the external interrupt signal 8B is detected. In the operation, the defective data is outputted while the defective data from the MUT 2 is stored. FIG. 6 (a) and (b) respectively illustrate the same operation in FIG. 4 (a) and (b). Accordingly in FIG. 6 defective cell address (1,1), (1,2) and (2,1) are respectively stored into the FIFO memory circuit 4 at the 2nd, 3rd and 5th pattern position. On the other hand, since the external interrupt signal 8B becomes "1" at the 1st, 2nd and 3rd pattern position, the reading operation of the FIFO memory circuit 4 is not executed at these positions. In this operation, the defective cell address (1,1) (1,2) are stored into the FIFO memory circuit 4 at the 3rd pattern position.

At the 4th, 5th and 6th pattern position, since the external interrupt signal 8B becomes "0", the reading operation is executed. In this operation, the FIFO memory circuit 4 stores the cell address (1,1) at the 2nd pattern position, stores the cell address (1,1), (1,2) at the 3rd pattern position and reads the cell address (1,1) at the 4th pattern position. Then it stores the cell address (2,1) and reads the cell address (1,2) at the 5th pattern position and reads the cell address (2,1) in the 6th pattern position. When the external interrupt signal 8B becomes "1", the selecting circuit 5 selects the external address signal 8A. In case when the signal 8B becomes "0", the selecting circuit 5 selects and outputs the signal 4A from the FIFO memory circuit 4. Therefore, the output signal 5A from the selecting circuit 5 is the same as shown in FIG. 4 (e).

At this case the cell address specified by the external address signal 8A is (X,Y). The cell address (X,Y) can be desirably specified. The FIFO reading state signal 4B becomes "1" at the 4th, 5th and 6th pattern positions. The memory circuit 6 writes the output signal 5A from the selecting circuit 5 as an address by the FIFO reading signal 8A as a writing signal. In these pattern positions the memory circuit 6 executes the reading operation other than the position of writing operation. Accordingly the memory circuit 6 outputs the read data to the output terminal 9 at the cell address (X,Y) as shown in FIG. 6 (f) and writes the data "1" into the cell address (1,1), (1,2) and (2,1). At the 6th pattern position, the memory map data of the contents of memory circuit 6 is the same as shown in FIG. 5. The wave form of the reading data is shown in FIG. 6 (g). In FIG. 6 (g), (X,Y) indicates the memory contents of the cell address (X,Y).

As described above, by the memory testing apparatus provided by the present invention as shown in FIG. 6, it becomes possible to store the defective cell address of MUT 2 into the memory circuit 6 and simultaneously to output the memory content having been stored therein. The external interrupt signal 8B can be independently applied for the defect detection of the MUT 2 and the storing of the result. In this context, real time detection of the defective cell address in the MUT 2 can be realized by specifying the address one by one to be read in the memory circuit 6. In this memory testing apparatus of FIG. 6, a time period for reading the memory circuit 6 is attained to be the same to the time period for testing of the MUT 2, therefore it is not necessary to make an operation frequency of the memory circuit 6 faster in the whole testing apparatus.

To store the data about defective cell into the memory circuit 6 without missing the resulted data of MUT 2 is realized under the condition that the following equation (1) is satisfied at any time in the operation of the apparatus illustrated in FIG. 1.

$$\{N+(Te/t)\}-M \leq C \qquad (1)$$

where
N is accumulated number of the defect detection
Te is external interrupt time
t is time period for 1 pattern process
M is number of patterns passing.
C is memory capacity of FIFO memory circuit.

With respect to the example shown in FIG. 6 at the 3rd pattern position, the value of the left of the equation (1) becomes closer to that of the right. In that case, the equation (1) is—

$$(2+3)-3<4.$$

Another example of preferred embodiment of the present invention is shown in FIG. 2. In this example the data signal at the output terminal 9 is held by a latch circuit 7 to be the time period required for one reading operation the same as the time "t" required for 1 pattern in FIG. 1. It realizes to output the data at a low speed from the output terminal 9 to outside by holding the output data from the memory circuit 6 in the latch circuit 7 as the time period for reading operation of the memory circuit 6 becomes the same as that of one pattern process. In this case, the above equation (1) is changed to the following equation (2).

$$(N+M1)-M \leq C \qquad (2)$$

where M1 is the number of reading operation from the outside.

For example, in the condition that t (time period for one pattern) is 100 ns, one reading operation period is 1 ns, the capacity of the FIFO memory circuit 4 is 16 KW, the number of defects is Nf, and defects of MUT 2 are continuously detected, the below described relation is satisfied by the equation (2).

$$\{Nf+Nf(100 \text{ ns}/1 \text{ us})-Nf\} \leq 16,000$$

Accordingly, Nf<160000 is obtained. This means that the data about defective cell written into the memory circuit 6 are not missed and able to be perfect until the 160,000 data about defective cell are continuously detected.

The other example of the embodiment of the present invention is shown in FIG. 3. In this embodiment, it employs a "MEMORY CAPACITY FULL" signal of the FIFO memory circuit 4 to the output terminal 10. It provides for an operation of applying the external interrupt signal 8B and the external address signal 8B to be held until the "MEMORY CAPACITY FULL" signal has not been detected, and the reading operation is completed without missing even in the case that continuous defect occurrence Nf in the MUT 2 is more than 160,000 in the example of FIG. 2.

In consequence of this, it realizes to store the result data of MUT 2 into the memory circuit 6 without missing even when defects detection of the MUT 2 cocoinuously occurs in large quantities.

As described above, in the memory testing apparatus of the present invention when the time period of required for the reading and the writing operations are alternately exchanged, these periods can be independently decided of each other.

Accordingly read out time to the memory circuit can be reduced short when the number of defective cell is not so large. The memory testing apparatus in accordance with the present invention attains that the operation frequency of the memory circuit can be less than the frequency of testing the MUT 2** when the time period of required for the reading and the writing operations are alternately exchanged.

What is claimed is:

1. A memory testing apparatus comprising;
   a pattern generating circuit which generates a testing signal pattern to be applied to a memory to be tested, expected data and a test address signal,
   a decision circuit which, upon application of said testing signal pattern to said memory to be tested, compares said expected data and output signal data from said memory to be tested and judges if a memory area designated by said test address signal is defective upon disagreement during said comparison, and outputs a defect indicating signal when a defect is detected,
   a FIFO circuit, to which is applied said defect indicating signal and said test address signal, for storing said test address signal when said defect indicating signal is inputted and outputting stored contents thereof and a FIFO reading state signal when an external interrupt signal is not applied thereto and not outputting the stored contents therein nor said FIFO reading state signal when said external interrupt signal is applied thereto,
   a selecting circuit, to which is applied the output data from said FIFO circuit and an eternal address signal, for selecting said external address signal when said external address signal and said external interrupt signal are applied thereto,
   and a memory circuit, to which is applied the output signal of said selecting circuit and said FIFO reading state signal, for writing data "1" into a memory area at an address designated by said output signal from said selecting circuit when said FIFO reading state signal is inputted, or for outputting stored contents in said memory area designated by said output signal of said selecting circuit to an output terminal when said FIFO reading state signal is not inputted.

2. A memory testing apparatus according to claim 1, further comprising a latch circuit arranged between said memory circuit and said output terminal to temporarily store said stored contents from said memory circuit.

3. A memory testing apparatus according to claim 1, wherein the FIFO circuit outputs a FIFO MEMORY CAPACITY FULL signal, that means the memory capacity of said FIFO is full, to another output terminal to prohibit said external interrupt signal from being applied to the FIFO circuit.

* * * * *